US012698440B2

(12) United States Patent
Kim et al.

(10) Patent No.: US 12,698,440 B2
(45) Date of Patent: Aug. 4, 2026

(54) ELECTRON TRANSPORT LAYER COMPOSITION FOR INKJET PRINTING AND METHOD FOR PREPARING SAME

(71) Applicant: Hansol Chemical Co., Ltd., Seoul (KR)

(72) Inventors: Do Hyeong Kim, Bongdong (KR); So Mang Kim, Jeonju (KR); Gyu Cheol Yoon, Jeonju (KR); Byung Ju Park, Gunsan (KR); Kyung Nam Kim, Daejeon (KR); Sung Min Ha, Jeonju (KR); Chun Rae Nam, Jeonju (KR)

(73) Assignee: Hansol Chemical Co., Ltd., Seoul (KR)

( * ) Notice: Subject to any disclaimer, the term of this patent is extended or adjusted under 35 U.S.C. 154(b) by 383 days.

(21) Appl. No.: 18/579,338

(22) PCT Filed: Jul. 5, 2022

(86) PCT No.: PCT/KR2022/009698
§ 371 (c)(1),
(2) Date: Jan. 13, 2024

(87) PCT Pub. No.: WO2023/287098
PCT Pub. Date: Jan. 19, 2023

(65) Prior Publication Data
US 2024/0343975 A1     Oct. 17, 2024

(30) Foreign Application Priority Data
Jul. 13, 2021     (KR) ........................ 10-2021-0091490

(51) Int. Cl.
*C09K 11/54* (2006.01)
*C09D 11/322* (2014.01)
(Continued)

(52) U.S. Cl.
CPC ............ *C09K 11/54* (2013.01); *C09D 11/322* (2013.01); *C09D 11/36* (2013.01); *H10K 50/16* (2023.02); *H10K 71/135* (2023.02)

(58) Field of Classification Search
CPC ....... C09K 11/54; C09D 11/322; C09D 11/36; C09D 11/033; C09D 11/037; C09D 11/30;
(Continued)

(56) References Cited

U.S. PATENT DOCUMENTS 10,392,342 B1 *  8/2019  Zhang ................... C07C 255/42
10,991,899 B2 *  4/2021  Kim ........................ H10K 50/11
(Continued)

FOREIGN PATENT DOCUMENTS

CN      110993808 A      4/2020
JP      2016-507090 A      3/2016
(Continued)

*Primary Examiner* — Ibrahim A Khan
(74) *Attorney, Agent, or Firm* — Young Basile Hanlon & MacFarlane, P.C.

(57) ABSTRACT
An electron transport layer composition for inkjet printing is described. The composition includes metal oxide nanoparticles and at least three solvents being different in terms of at least one of viscosity, polarity, or vapor pressure. A method for preparing the composition and a light-emitting device having an electron transport layer formed from the composition are also described.

18 Claims, 11 Drawing Sheets

(51) Int. Cl.
　　*C09D 11/36*　　　(2014.01)
　　*H10K 50/16*　　　(2023.01)
　　*H10K 71/13*　　　(2023.01)
(58) Field of Classification Search
　　CPC ...... H10K 50/16; H10K 71/135; H10K 99/00;
　　　　　　H10K 50/00; H10K 50/115; H10K 71/15
　　See application file for complete search history.

(56) References Cited

U.S. PATENT DOCUMENTS

| | | | |
|---|---|---|---|
| 11,127,912 | B2 * | 9/2021 | Seo ........................ C09K 11/54 |
| 11,329,189 | B2 * | 5/2022 | Min ....................... H10K 50/16 |
| 12,274,114 | B2 * | 4/2025 | Utsumi .................... G09F 9/30 |
| 12,356,772 | B2 * | 7/2025 | Kim ........................ C09K 11/70 |
| 2008/0233429 | A1 | 9/2008 | Oguma et al. |
| 2011/0127512 | A1 | 6/2011 | Goto et al. |
| 2012/0111409 | A1 | 5/2012 | Kim et al. |
| 2018/0230321 | A1 * | 8/2018 | Pan ........................ C09D 11/30 |
| 2018/0237649 | A1 * | 8/2018 | Pan ....................... C09D 11/322 |
| 2019/0048259 | A1 * | 2/2019 | Kim ....................... C09K 11/703 |
| 2019/0131557 | A1 * | 5/2019 | Lee .................... H10K 85/6572 |
| 2020/0067005 | A1 | 2/2020 | Park et al. |
| 2020/0071612 | A1 * | 3/2020 | Won ..................... H10K 50/115 |
| 2020/0083470 | A1 * | 3/2020 | Chung .................... C09K 11/70 |
| 2020/0111933 | A1 * | 4/2020 | Chung ................. H10H 20/816 |
| 2020/0227663 | A1 | 7/2020 | Kim et al. |
| 2020/0291251 | A1 * | 9/2020 | Pan ...................... C09D 11/322 |
| 2020/0321490 | A1 * | 10/2020 | Yang .................... H10H 20/812 |
| 2020/0362240 | A1 * | 11/2020 | Yang ..................... H10K 50/16 |
| 2021/0179939 | A1 * | 6/2021 | Stokes ................. C09K 11/565 |
| 2021/0313533 | A1 * | 10/2021 | Zhang ................. H10K 50/171 |
| 2023/0217675 | A1 * | 7/2023 | Takenaka .............. H10K 85/40 257/40 |
| 2023/0272277 | A1 * | 8/2023 | Kim ..................... C09K 11/703 257/13 |
| 2023/0303918 | A1 * | 9/2023 | Yaguchi .............. C09K 11/025 |
| 2024/0240076 | A1 * | 7/2024 | Goto .................... C09K 11/025 |
| 2024/0343975 | A1 * | 10/2024 | Kim ..................... H10K 50/115 |
| 2024/0352268 | A1 * | 10/2024 | Park ...................... C09D 11/52 |

FOREIGN PATENT DOCUMENTS

| | | | |
|---|---|---|---|
| KR | 10-2011-0041463 | A | 4/2011 |
| KR | 10-2012-0048436 | A | 5/2012 |
| KR | 10-2020-0021726 | A | 3/2020 |
| KR | 10-2020-0088695 | A | 7/2020 |
| WO | 2019/078235 | A1 | 4/2019 |
| WO | 2020/067011 | A1 | 4/2020 |

* cited by examiner

1 - drop                    1 × 9 pattern

One-dot (for Spin coating)

ELECTRON TRANSPORT LAYER COMPOSITION FOR INKJET PRINTING AND METHOD FOR PREPARING SAME

CROSS-REFERENCE TO RELATED APPLICATION

This application claims priority to Korean Patent Application No. 10-2021-0091490, filed on Jul. 13, 2021, and all the benefits accruing therefrom under 35 U.S.C. § 119, the content of which is incorporated herein in its entirety by reference.

TECHNICAL FIELD

The present invention relates to an electron transport layer composition for inkjet printing containing metal oxide nanoparticles and at least three solvents that differ in terms of at least one of viscosity, polarity, or vapor pressure and that is capable of inkjet ejection, a method for preparing the composition, and a light-emitting device including an electron transport layer formed of the composition.

BACKGROUND

Quantum-dot light-emitting devices (QLED) are receiving attention as next-generation displays due to their high quantum efficiency and color purity. Although solution-based spin coating is mainly used to manufacture QLEDs, this spin coating is flawed in enlargement and commercialization, and much research is being conducted on ink-jetting. The application of inkjet printing allows for simple and inexpensive processes and thus is more advantageous for commercialization and enlargement.

Much research has been recently conducted on quantum-dot solutions for inkjet printing, but little research has been conducted on an electron transport layer (ETL) for inkjet printing. Particularly, research on the configuration of an electron transport layer (ETL) for inkjet printing is essentially required to form a uniform electron transport layer thin film on a patterned emission layer (EML).

SUMMARY

The present inventors recognized that an ethanol-based electron transport layer composition that is currently widely known cannot be uniformly ejected by inkjet printing equipment.

The present invention has been made to address the above-mentioned problems. An aspect of the present invention is to provide an electron transport layer composition for inkjet printing and a method for preparing the same. The composition is capable of facilitating uniform ejection through inkjet printing as well as forming a uniform film from an ejected ink by mixing at least three solvents with an adjusted specific property.

Another aspect of the present invention is to provide a light-emitting device including an electron transport layer formed by ink-jetting using the above-described electron transport layer composition.

Other aspects and advantages of the present invention will be clarified by following detailed description and claims.

In accordance with an aspect of the present invention, the electron transport layer composition for inkjet printing includes metal oxide nanoparticles and at least three solvents that differ in terms of at least one of viscosity, polarity, or vapor pressure. The composition is capable of being ejected by ink-jetting.

In an embodiment according to the present invention, the composition may have a viscosity of 1.0 to 3.0 cps at 20° C., a vapor pressure of 0.6 to 45 mmHg at 20° C., a contact angle of 25 to 80°, and a solid content of 5 to 30 wt %.

In an embodiment according to the present invention, the at least three solvents may include dimethyl sulfoxide (DMSO), ethanol, 2-methoxy ethanol, and butanol.

In an embodiment according to the present invention, the mixing ratio of the dimethyl sulfoxide (DMSO), ethanol, 2-methoxy ethanol, and butanol may be a volume ratio of 3-8:1-3:1-2:0-1.

In an embodiment according to the present invention, the metal oxide nanoparticles may be Zn-containing metal oxide nanoparticles.

In an embodiment according to the present invention, in the Zn-containing metal oxide nanoparticles, a metal capable of increasing the ZnO band gap may be alloyed.

In an embodiment according to the present invention, the Zn-containing metal oxide nanoparticles may be ZnMgO.

In an embodiment according to the present invention, the metal oxide nanoparticles may have an organic ligand having hydrophilic moieties attached to a portion of or the entire surface thereof.

In an embodiment according to the present invention, the organic ligand may include at least two hydrophilic moieties selected from a carboxyl group and a hydroxyl group.

In an embodiment according to the present invention, the organic ligand may be contained in the range of 0.0001 to 10 mol relative to 1 mol of a metal included in the metal oxide nanoparticles.

In an embodiment according to the present invention, the metal oxide nanoparticles may include a polymer coating layer formed on a portion of or the entire surface thereof.

In accordance with another aspect of the present invention, there is provided a light-emitting device that includes a first electrode, a second electrode disposed to face the first electrode, an emission layer disposed between the first electrode and the second electrode, a hole transport layer disposed between the first electrode and the emission layer, and an electron transport layer disposed between the emission layer and the second electrode and formed of the above-described electron transport layer composition.

In an embodiment according to the present invention, the electron transport layer may be formed by inkjet printing.

In an embodiment according to the present invention, the light emitting device may further include at least one of a hole injection layer or an electron injection layer.

In accordance with still another aspect of the present invention, there is provided a method for preparing an electron transport layer composition for inkjet printing. The method includes a first step of adding a basic substance to a reaction solution, in which a zinc-containing compound and a compound containing a metal capable of increasing the ZnO band gap are dissolved, followed by precipitation, thereby preparing a metal oxide nanoparticle dispersion. The method also includes a second step of adding, to the prepared metal oxide nanoparticle dispersion, at least three solvents that differ in terms of at least one of viscosity, polarity, or vapor pressure, followed by mixing, thereby preparing an electron transport layer composition.

In an embodiment according to the present invention, the metal oxide nanoparticle dispersion in the first step may further contain an organic ligand, the organic ligand being contained in a content of 10 wt % or less relative to 100 wt % of the metal oxide nanoparticle dispersion.

In an embodiment according to the present invention, the electron transport layer composition prepared in the second step may further contain a monomer, the monomer being contained in a content of 10 vol % or less relative to 100 vol % of the electron transport layer composition.

According to an embodiment of the present invention, at least three solvents that differ in terms of a property, such as viscosity, polarity, or vapor pressure, can be used in a mixture to provide an electron transport layer composition for inkjet printing capable of facilitating uniform ejection by ink-jetting as well as forming a uniform film from an ejected ink.

Furthermore, a predetermined ligand and monomer (dispersant) can be applied in the synthesis of metal oxide nanoparticles used for an electron transport layer to secure the uniformity of a formed film.

Therefore, embodiments of the electron transport layer composition of the present invention not only can be advantageously applied to the manufacture of light-emitting devices, specifically, self-light-emitting displays through an inkjet printing process, but also can exert more advantageous effects in commercialization and enlargement by applying a simple and inexpensive inkjet process.

The advantageous effects according to the present invention are not limited by the contents exemplified above, and further various advantageous effects are included herein.

4

Figure 15:
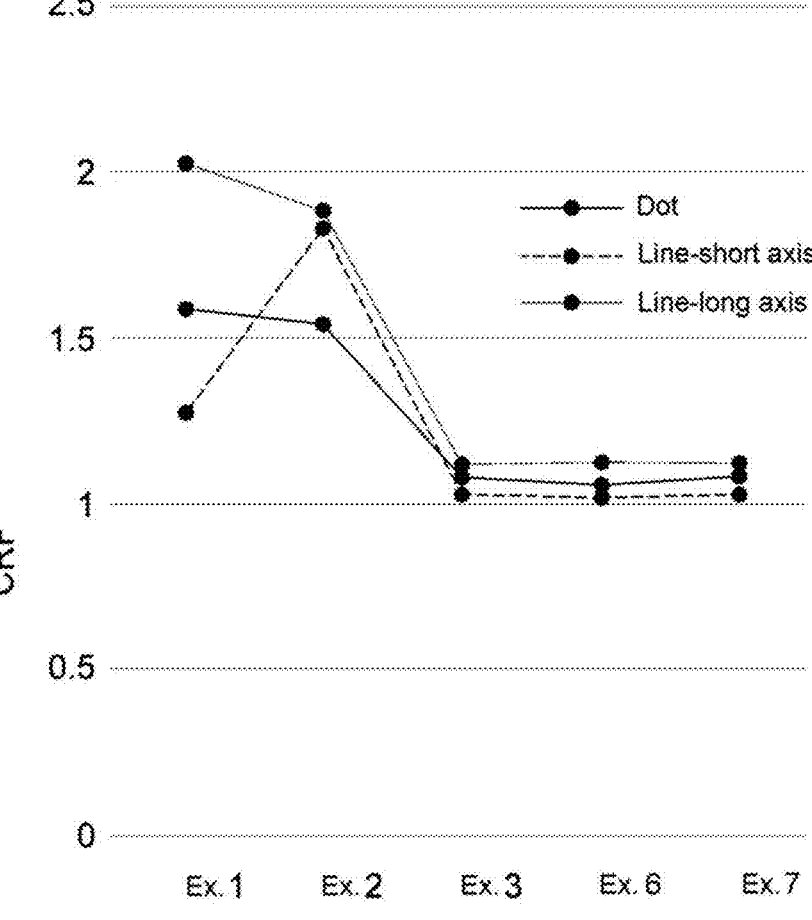

FIG. 15 shows a graph of coffee ring factor (CRF) results of ink shapes formed on substrates by using the electron transport layer compositions of Examples 1 to 3 and 6 to 7.

Figure 16:
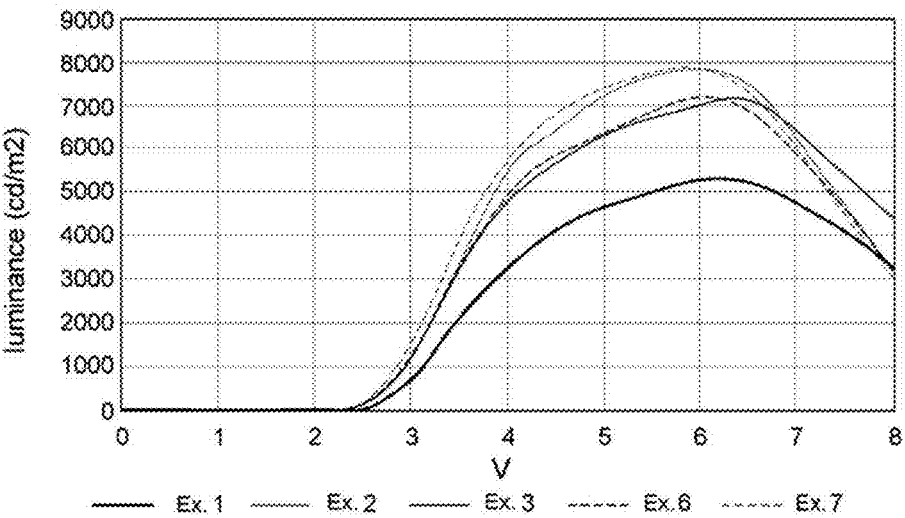

FIG. 16 shows a graph of luminous efficiencies of light-emitting devices manufactured using the electron transport layer compositions of Examples 1 to 3 and 6 to 7.

Figure 17:
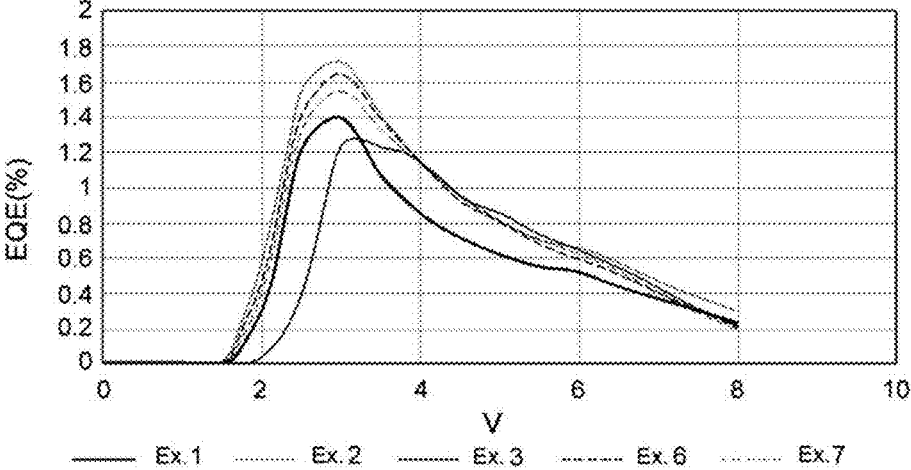

FIG. 17 shows a graph of quantum efficiencies of light-emitting devices manufactured using the electron transport layer compositions of Examples 1 to 3 and 6 to 7.

DETAILED DESCRIPTION

Hereinafter, the present invention will be described in detail.

All terms (including technical and scientific terms) used in this specification, unless otherwise defined, may be used in the meaning commonly understood by those of ordinary skill in the art to which the present invention pertains. In addition, terms defined in a commonly used dictionary are not to be interpreted ideally or excessively unless clearly defined in particular.

Throughout the specification, when a certain part "includes", "contains", or "comprises" a certain element, such an expression is to be understood as open-ended terms having the possibility of further including another element but not excluding another element, unless otherwise stated. Throughout the specification, "above" or "on" means not only when it is located above or under the target part, but also includes the case where there is another part in the middle, and it does not mean that it is positioned above with respect to the direction of gravity.

Herein, "(meth)acrylate" indicates acrylate and methacrylate, "(meth)acryl" indicates acryl and methacryl, and "(meth)acryloyl" indicates acryloyl and methacryloyl.

Herein, "monomeric body" has the same meaning as "monomer". The monomer as used in the present invention is distinguished from an oligomer and a polymer and refers to a compound having a weight average molecular weight of 1,000 or less.

The present invention is to provide an electron transport layer composition capable of ejection by inkjet printing and implementing device characteristics.

To this end, at least three solvents capable of ejection considering appropriate viscosity and vapor pressure for inkjet equipment are selected and mixed at a predetermined ratio, and this mixture is used as a solvent for an ink composition.

In addition, a predetermined ligand, monomer, or dispersant for preventing microparticle agglomeration can be added to the surface of the metal oxide nanoparticles to mitigate the coffee ring effect (CRF) in the inkjet ejection, thereby securing film uniformity.

Therefore, the present invention can provide an electron transport layer through an inkjet printing process and a self-light-emitting display including the same.

Electron Transport Layer Composition for Inkjet Printing

An electron transport layer composition according to an embodiment of the present invention is an ink composition that can be ejected by typical ink-jetting to form an electron transport layer (ETL).

In an embodiment, the electron transport layer composition contains metal oxide nanoparticles and at least three solvents that differ in terms of at least one of viscosity, polarity, or vapor pressure. These components are contained at a predetermined ratio. The composition may further contain, if necessary, at least one additive that is common in the art.

Hereinafter, the configuration of the electron transport layer composition will be described in detail.

Metal Oxide Nanoparticles

The electron transport layer composition according to the present invention contains metal oxide nanoparticles.

The metal oxide nanoparticles may be any material that is used in an electron transport layer in the art without limitation. For example, common metal oxide nanoparticles used as a dopant material may be used, and non-limiting examples thereof may include $In_2S_3$, $Cu_2S$, $Ag_2S$, ZnSe, ZnS, ZnO, ZnTe, ZnSe, $TiO_2$, $SnO_2$, ZnS, or forms in which at least one element is added to the above-mentioned components.

In an embodiment, the metal oxide nanoparticles are Zn-containing metal oxide nanoparticles and, more specifically, may be those obtained by alloying with a metal (M) capable of increasing the ZnO band gap [ZnMO (M=Ca or Mg)]. The metal (M) capable of increasing the ZnO band gap is Ca or Mg. These metals have similar ionic radii to Zn and thus can be incorporated into the ZnO lattice without causing stress and can increase the ZnO band gap through the ZnO size reduction. Preferably, the Zn-containing metal oxide may be ZnMgO.

As such, the application of ZnO nanoparticles, of which the band gap is increased by alloying, to the electron transport layer induces an upshift in the conduction band minimum (CBM), resulting in the proximity between the CBM of a quantum-dot emission layer and the electron transport layer, which lowers the electron energy barrier and consequently promotes the injection of electrons into a quantum-dot region. Therefore, a light-emitting device having an electron transport layer containing alloyed ZnO nanoparticles, compared with a device having an electron transport layer containing ZnO nanoparticles, is excellent in terms of luminance and efficiency and can have higher luminous efficiency even at a lower driving voltage. That is, the application of the above-described electron transport layer can reduce the electron injection barrier, thereby reducing the driving voltage of a QLED, improving efficiency, and furthermore reducing the power consumption. A reduction in the driving voltage of a device also reduces the heat generation of the device, so the lifespan of the device can be expected to increase.

In an embodiment, the metal oxide nanoparticles may have an organic ligand having hydrophilic moieties attached to a portion of or the entire surface thereof.

The organic ligand may be any organic ligand that is known in the art without limitation, and examples thereof may include: $C_5$-$C_{20}$ alkyl carboxylic acids, alkenyl carboxylic acids, or alkynyl carboxylic acids; pyridine; mercapto alcohols; thiols; phosphines; phosphine oxides; primary amines; secondary amines; or a combination thereof. Specifically, the organic ligand may contain at least two hydrophilic moieties selected from a carboxyl group and a hydroxyl group, and more specifically, a ligand material having the above-described carboxyl group and/or hydroxyl group hydrophilic moieties at both ends of a molecular structure thereof. Non-limiting examples of a usable organic ligand may include mono(2-acryloyloxyethyl) succinate (MAES), mono-2-(methacryloyloxy)ethyl succinate (MMES), 2-(2-methoxyethoxy) acetic acid (MEAA), or a mixture thereof.

Such an organic ligand is attached to the surface of metal oxide nanoparticles to mitigate the coffee ring effect (CRF) in the inkjet ejection, thereby securing film uniformity. The coffee ring effect (CRF) indicates the non-uniformity of particle density distribution due to the movement of colloidal particles to the edge by the hydrodynamic effect during evaporation. That is, the smaller the particle size, the more the particle can move to the edge, so smaller particles are distributed closer to the edge of a droplet and relatively larger particles are distributed closer to the center of the droplet. In the present invention, a predetermined organic ligand and/or a monomer to be described later are introduced into the electron transport layer composition, thereby minimizing the coffee ring effect and maximizing the film uniformity.

The content of the organic ligand is not particularly limited and may be appropriately adjusted within a content range known in the art. Considering dispersibility and film uniformity, the organic ligand may be contained in the range of 0.0001 to 10 mol, specifically 0.001 to 5 mol, relative to 1 mol of a metal, such as zinc (Zn), contained in the metal oxide nanoparticles.

In an embodiment, the metal oxide nanoparticles may include a polymer coating layer formed on a portion of or the entire surface thereof.

The components of the polymer coating layer are not particularly limited, and common polymers known in the art can be applied. For example, the polymer coating layer may be formed using an acrylic or methacrylic polymer or polyethylene glycol without limitation. Specifically, a (meth)acrylic polymer containing a predetermined content of an intermolecular polar functional group and/or polyethylene glycol having hydrophilic moieties are preferably used. These functional groups can react with some chemicals, and these reactions are used to induce polymer coating on the surface of the metal oxide nanoparticles.

The monomer (single molecule) forming the polymer coating layer may be a common (meth)acrylate monomer known in the art. However, the monomer is not particularly limited thereto. Non-limiting examples of a usable monomer may include: monofunctional (meth)acrylate monomers, such as caprolactone acrylate, ortho-phenylphenol ethoxy acrylate, lauryl acrylate, isodecyl acrylate, tetrahydrofurfuryl acrylate, 2-hydroxyethyl acrylate, 4-hydroxybutyl acrylate, 2-hydroxyethyl methacrylate, ethoxy ethoxy ethyl acrylate, isobornyl (meth)acrylate, alkoxylated tetrahydrofurfuryl (meth)acrylate, and 2-ethylhexyl acrylate; di(meth)acrylates having an aromatic ring, such as ethylene glycol di(meth)acrylate, propylene glycol di(meth) acrylate, polyolefin glycol di(meth)acrylate, ethoxylated polypropylene glycol di(meth)acrylate, 2-hydroxy-3-acryloyloxy propyl methacrylate, 2-hydroxy-1,3-dimethacryloxypropane, dioxane glycol di(meth)acrylate, tricyclodecane dimethanol di(meth)acrylate, 1,4-butanediol di(meth) acrylate, glycerin di(meth)acrylate, 1,6-hexanediol di(meth) acrylate, 1,9-nonanediol di(meth)acrylate, 1,10-decanediol di(meth)acrylate, neopentyl glycol di(meth)acrylate, 2-methyl-1,8-octanediol di(meth)acrylate, 1,9-nonanediol di(meth)acrylate, butyl ethyl propanediol di(meth)acrylate, 3-methyl-1,5-pentanediol di(meth)acrylate, tripropylene glycol diacrylate, dipropylene glycol diacrylate, triethylene glycol diacrylate, and triclodecane dimethanol diacrylate; trifunctional (meth)acrylate monomers, such as ethoxylated glycerin tri(meth)acrylate, trimethylolpropane tri(meth) acrylate, trimethylolpropane (ethylene oxide) modified triacrylate, ethoxylated trimethylolpropane tri(meth)acrylate, propoxylated trimethylolpropane tri(meth)acrylate, pentaerythritol tri(meth)acrylate, trimethylolpropane (propylene oxide) modified triacrylate, and tris(2-hydroxyethyl) isocyanurate triacrylate; tetrafunctional (meth)acrylate monomers, such as pentaerythritol tetra(meth)acrylate, ditrimethylolpropane tetra(meth)acrylate, ethoxylated pentaerythritol tetra(meth)acrylate (tetrafunctional monomer), or mixtures thereof; pentafunctional (meth)acrylate monomers, such as dipentaerythritol pentaacrylate, propionic acid-modified dipentaerythritol pentaacrylate, dipentaerythritol pentamethacrylate, propionic acid-modified dipentaerythritol pentamethacrylate, or a mixture thereof; and hexafunctional (meth)acrylate monomers, such as dipentaerythritol hexaacrylate, caprolactone-modified dipentaerythritol hexaacrylate, dipentaerythritol hexamethacrylate, caprolactone-modified dipentaerythritol hexamethacrylate, or a mixture thereof.

The polymer coating layer is formed on the surface of the metal oxide nanoparticles to mitigate the coffee ring effect (CRF) in the inject ejection, thereby securing film uniformity.

Meanwhile, the present invention has been described mainly with metal oxide nanoparticles as a material constituting the electron transport layer. However, the material constituting the electron transport layer is not limited to the above-described material, and the application of organic materials or organic-inorganic composites usable as materials for the electron transport layer in the art falls within the range of the present invention.

In the present invention, the content of the metal oxide nanoparticles is not particularly limited and may be appropriately adjusted within a content range known in the art. For example, the content of the metal oxide nanoparticles may be 5 to 30 parts by weight, specifically 10 to 20 parts by weight, relative to the total weight (e.g., 100 parts by weight) of the electron transport layer composition.

Solvent

The electron transport layer composition according to the present invention contains at least three solvents with different properties, such as viscosity, polarity, and vapor pressure.

Conventional metal oxide nanoparticles, such as ZnMgO, employ an alcohol-based solvent as a dispersion medium due to the nature of materials. However, the use of ethanol alone causes poor inkjet ejection, even with the implementation of device characteristics.

The ejection conditions of inkjet equipment may be largely classified into viscosity and vapor pressure. Too high or too low a viscosity fails to obtain a uniform film, and the degree of ejection is determined by the vapor pressure. The present invention is characterized in that at least three solvents that can satisfy properties of viscosity and vapor pressure properly considered for the inkjet ejection are selected. The mixing ratio thereof is adjusted within a predetermined range to thereby configure a solvent for an electron transport layer ink composition.

In an embodiment, the electron transport layer composition of the present invention containing at least three solvents may have a viscosity of 1.0 to 3.0 cps at 20° C., a vapor pressure of 0.6 to 45 mmHg at 20° C., a contact angle of 25 to 80°, and a solid content of 5 to 30 wt %. More specifically, the electron transport layer composition of the present invention may have a viscosity of 1.2 to 2.0 cps, a vapor pressure of 1.0 to 30 mmHg, a contact angle of 30 to 50°, and a solid content of 5 to 25 wt %.

The electron transport layer composition, when having the above-described properties of viscosity, vapor pressure, and contact angle, can facilitate inkjet ejection as well as implement device characteristics due to the uniformity of the ejected ink.

The electron transport layer composition according to the present invention, when satisfying the above-described viscosity, vapor pressure, and contact angle characteristics, is not particularly limited in terms of specific components of at least three solvents and/or content thereof.

In an embodiment, the at least three solvents include dimethyl sulfoxide (DMSO), ethanol, 2-methoxy ethanol, and butanol.

That is, dimethyl sulfoxide (DMSO), which has viscosity and good dispersibility, may be used as a main solvent in the present invention, but the use of the DMSO solvent alone considering the application of inkjet ejection causes poor wettability. Meanwhile, two solvents with ethanol with excellent wettability cannot secure the levels of viscosity and contact angle properties required for inkjet ejection characteristics. In the present invention, when the DMSO solvent and ethanol are used, and mixed with 2-methoxy ethanol and butanol, which have appropriate viscosity, among alcohol-based solvents, the final composition is controlled to satisfy all of the above-described viscosity, vapor pressure, and contact angle characteristics. For example, the viscosities of the solvents indicate 1.98 cps (DMSO), 1.07 cps (ethanol), 1.70 cps (2-methoxy ethanol), and 2.57 cps (butanol). In addition, the vapor pressures of the solvents indicate 0.6 mmHg (DMSO), 44.62 mmHg (ethanol), 6 mmHg (2-methoxy ethanol), and 5.47 mmHg (butanol). The above-described at least three solvents can be prepared at a predetermined mixing ratio to thereby configure an optimized electron transport layer composition with a viscosity of 1.0-3.0 cps, a contact angle of 25 to 80°, and a vapor pressure of 0.6 to 45 mmHg.

In an embodiment according to the present invention, at least three solvents include dimethyl sulfoxide (DMSO) as a main solvent, and this DMSO may be contained in a content of 30 vol % or more relative to 100 vol % of the entire solvent. In addition, the content of ethanol may be 10 vol % or more relative to 100 vol % of the entire solvent. The content of 2-methoxy ethanol may be 10 vol % or more relative to 100 vol % of the entire solvent, and the content of butanol may be 0 to 50 vol % relative to 100 vol % of the entire solvent. Herein, the entire solvent may mean the sum of volumes of the above-described at least three solvents. The above-described at least three solvents may further include a dispersion solvent contained in a metal oxide nanoparticle dispersion to be described later.

In an embodiment, the mixing ratio of dimethyl sulfoxide (DMSO), ethanol, 2-methoxy ethanol, and butanol in the at least three solvents may be a volume ratio of 3-8:1-3:1-2:0-1, and preferably, a volume ratio of 5:3:1:1. If the proportion of DMSO is less than 3, the inkjet ejection is unstable and the fraction of the alcohol-based solvent is relatively high, resulting in advantageous results only in device characteristics. In addition, 2-methoxy ethanol and butanol are added to secure predetermined viscosity and contact angle properties of metal oxide nanoparticles (ZnMgO), and when the content ratios of these solvents exceed 1, respectively, the viscosity increases, resulting in bad influence on inkjet ejection and device implementation.

In the present invention, the content of the at least three solvents is not particularly limited, and may be appropriately adjusted within a content range known in the art. For example, the content of the at least three solvents may be a balanced amount satisfying 100 parts by weight, and specifically, 70 to 95 parts by weight, of the corresponding electron transport layer composition.

Additives

In addition to the above-described components, the electron transport layer composition of the present invention may contain at least one additive known in the art, without limitation, as long as the advantageous effects of the invention are not hindered.

Examples of a usable additive may include a light stabilizer, a heat stabilizer, a light initiation accelerator, a heat initiation accelerator, a smoother, a toughening agent, a thickener, a colorant, a reactivity diluent, a coupling agent, a dispersant, a solvent, and the like. These can be used alone or in combinations of two or more. The content of the additive may be appropriately adjusted within a range known in the art and is not particularly limited. For example, the one or more additives may be contained in a content of 0.01 to 5 parts by weight, specifically 0.01 to 2 parts by weight, relative to the total weight of the corresponding electron transport layer composition.

The electron transport layer composition for inkjet printing according to the present invention may be prepared by mixing and stirring the above-described metal oxide nanoparticles, at least three solvents, and ligand, monomer, and other additives that are mixed as needed, by a common method known in the art.

An example for preparing the electron transport layer composition may include a first step of adding a basic substance to a reaction solution, in which a zinc-containing compound and a compound containing a metal capable of increasing the ZnO band gap are dissolved, followed by precipitation, thereby preparing a metal oxide nanoparticle dispersion. Preparing the electron transport layer composition may also include a second step of adding, to the prepared metal oxide nanoparticle dispersion, at least three solvents that differ in terms of at least one of viscosity, polarity, or vapor pressure, followed by mixing, thereby preparing the electron transport layer composition.

In the first step, the zinc-containing compound and the metal-containing compound are not particularly limited, and any material that is known in the art can be used without limitation. For example, Zn acetate dihydrate, Zn chloride, Zn nitrate, Zn sulfate, Mg acetate tetrahydrate, or the like may be used.

In addition, the basic material is not particularly limited, and any material that is known in the art can be used without limitation. For example, at least one material selected from the group consisting of tetramethyl ammonium hydroxide (TMAH), potassium hydroxide (KOH), sodium hydroxide (NaOH), and amines may be used.

In the first step, the metal oxide nanoparticle dispersion may further contain an organic ligand. The organic ligand may be contained in the range of 0 to 10 wt %, specifically more than 0% and no more than 5 wt % relative to the total weight (e.g., 100 wt %) of the metal oxide nanoparticle dispersion.

In the first step, the metal oxide nanoparticle dispersion may further contain a polymer. This polymer may include common hydrophilic moieties known in the art and, for example, may include at least two hydrophilic moieties selected from a carboxyl group and a hydroxyl group. Examples of a usable polymer may include polyethylene glycol (PEG) having a carboxyl group and the like. The polymer may be contained in the range of 0 to 10 wt % relative to the total weight (e.g., 100 wt %) of the metal oxide nanoparticle dispersion, but the range is not particularly limited thereto.

After the basic material is added, the temperature is raised to 55 to 65° C., and then the dispersion is stirred and reacted at a uniform rate for approximately 0.5 to 2 hours to precipitate nanoparticles. After that, metal oxide nanoparticles are separated using solvent and non-solvent characteristics, thereby preparing a dispersion in which the metal oxide nanoparticles are uniformly dispersed.

Non-limiting examples of the solvent may include hexane, benzene, xylene, toluene, octane, chloroform, chlorobenzene, tetrahydrofuran (THF), methylene chloride, 1,4-dioxane, diethyl ether, cyclohexane, dichlorobenzene, and the like, and these may be used alone or in a mixture of two or more thereof. Non-limiting examples of a usable non-solvent may include acetone, ethanol, methanol, butanol, propanol, isopropyl alcohol, tetrahydrofuran, dimethyl sulfoxide, dimethylformamide, and the like, and these may be used alone or in a mixture of two or more thereof.

In the second step, the mixing ratio between the metal oxide nanoparticles and the at least three solvents may be a weight ratio of 5-30:95-70. However, the mixing ratio is not particularly limited thereto and may be appropriately adjusted within a content range known in the art.

In addition, the mixing method is not particularly limited, and for example, a common mixer known in the art, such as a homo-disper, a homo-mixer, a universal mixer, a planetary mixer, a kneader, and a three-roller mill may be used.

The electron transport layer composition prepared in the second step may further contain at least one of a monomer and a dispersant. The monomer and/or dispersant may be contained in the range of 0 to 10 vol %, specifically more than 0 vol % and no more than 5 vol %, relative to 100 vol % of the electron transport layer composition.

The electron transport layer composition of the present invention configured as described above can provide excellent workability and processability through optimized viscosity and vapor pressure characteristics. In particular, the electron transport layer composition can be usefully applied to inkjet printing by ensuring uniformity and stability in the terms of inkjet ejection properties, the shape of an ejected ink, and the shape of an ink formed on the substrate.

Light-Emitting Device

A light-emitting device according to an embodiment of the present invention is distinguished from conventional light-emitting devices in that the former includes an electron transport layer formed of the above-described electron transport layer composition.

In an embodiment, the light-emitting device includes a first electrode, a second electrode disposed to face the first electrode, an emission layer disposed between the first electrode and the second electrode, a hole transport layer disposed between the first electrode and the emission layer, and an electron transport layer disposed between the emission layer and the second electrode and formed by inkjet printing of the above-described electron transport layer composition. The light-emitting device may further include, as needed, at least one of a hole injection layer and an electron injection layer.

Hereinafter, the present invention will be described by exemplifying a quantum-dot light-emitting device. However, the light-emitting device is not limited thereto and can be applied to various types of light-emitting devices, such as an organic light-emitting device.

The first electrode is disposed on a substrate. This substrate may be a glass substrate or transparent plastic substrate, which is transparent and has a flat surface. The substrate may be used after ultrasonic cleaning with a solvent, such as isopropyl alcohol, acetone, or methanol, and then UV-ozone treatment to remove contaminants.

The first electrode may serve as an anode. For example, the anode may be formed of a metal oxide satisfying transparent/opaque conditions or other non-oxide inorganic materials, including a metal. For bottom light emission, the first electrode may be formed of a transparent conductive metal, such as transparent ITO, IZO, ITZO, or AZO.

The hole injection layer and the hole transport layer are disposed on the first electrode. These hole injection and hole transport layers facilitate the injection of holes from the first electrode and serve to transfer holes to the emission layer. The hole transport layer may be formed of an organic or inorganic material. Examples of the organic material may include 4,4'-N,N'-dicarbazole-biphenyl (CBP), N,N'-diphenyl-N,N'-bis(1=naphthyl)-1,1'-biphenyl-4,4"-diamine (α-NPD), 4,4',4"-tris(N-carbazolyl)-triphenylamine (TCTA), TFB, or N,N'-di(4-(N,N'-diphenyl-amino)phenyl)-N.N'-diphenylbenzidine (DNTPD), and examples of the inorganic material may include an oxide, such as NiO or MoO$_3$. For example, poly(ethylenedioxythiophene):polystyrene sulphonate (PEDOT:PSS) may be provided for the hole injection layer. In addition, TFB, poly(9-vinlycarbazole) (PVK), or the like may be provided for the hole transport layer.

The emission layer may be disposed on the hole transport layer, and quantum dots may be provided for the emission layer. For example, the emission layer may be formed by coating a dispersion, in which quantum dots are dispersed in a solvent, on the hole transport layer through a solution process and then volatilizing the solvent. Examples of the coating method may include drop casting, spin coating, dip coating, spray coating, flow coating, screen printing, or inkjet printing, which may be used alone or in combination.

The quantum dots (QDs) constituting the emission layer may be called a nano-sized semiconductor material. Atoms constitute a molecule, and molecules constitute a set of small molecules called a cluster, thereby constituting a nanoparticle. When such a nanoparticle has a semiconductor characteristic, the nanoparticle is referred to as a quantum dot. When the quantum dot is supplied with energy from the outside to reach an excited state, the quantum dot can autonomously emit energy based on a corresponding energy bandgap.

Such a quantum dot may have a homogeneous single-layer structure; a multi-layer structure, such as a core-shell type or a gradient structure; or a mixed structure thereof.

A single-layer structured quantum dot, or a core and/or a plurality of shell layers excluding the surface (outermost), which constitute a multi-layer structured quantum dot, may have components each being independently selected from a group II-VI compound, a group III-V compound, a group IV-VI compound, a group IV element, a group IV compound, and a combination thereof. In a case of a plurality of shell layers, the respective layers may contain different components, for example, (semi-) metal oxides, and may be freely configured from the components exemplified below.

For example, the group II-VI compound may be selected from the group consisting of: a binary compound selected from the group consisting of CdO, CdS, CdSe, CdTe, ZnO, ZnS, ZnSe, ZnTe, HgS, HgSe, HgTe, MgSe, MgS, and a mixture thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe, and a mixture thereof.

As another example, the group III-V compound may be selected from the group consisting of: a binary compound selected from the group consisting of GaN, GaP, GaAs, GaSb, AlN, AlP, AlAs, AlSb, InN, InP, InAs, InSb, and a mixture thereof; a ternary compound selected from the group consisitng of GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

As another example, the group IV-VI compound may be selected from the group consisting of: a binary compound selected from the group consisting of SnS, SnSe, SnTe, PbS, PbSe, PbTe, and a mixture thereof; a ternary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof.

As another example, the group IV element may be selected from the group consisting of Si, Ge, and a mixture thereof. The group IV compound may be a binary compound selected from the group consisting of SiC, SiGe, and a mixture thereof.

The above-described binary compound, ternary compound, or quaternary compound may be present in a uniform concentration in a particle or may be present in a state in which the concentration distribution is partially differently divided, in the same particle. Alternatively, the compounds may have a core-shell structure in which one quantum dot encloses another quantum dot. The interface between the core and the shell may have a concentration gradient in which the concentration of an element present in the shell decreases toward the center.

The form of the quantum dot is not particularly limited as long as the form is generally used in the art. For example, spherical, rod-shaped, pyramidal, disk-shaped, multi-arm, or cubic nanoparticles, nanotubes, nanowires, nanofibers, nanoplatelet particles, and the like may be used.

The size of the quantum dot is not particularly limited, and may be appropriately adjusted within a conventional range that is known in the art. For example, the average particle diameter (D$_{50}$) of the quantum dot may be 1 to 20 nm, and specifically 2 to 15 nm. When the particle size of the quantum dot is controlled to a range of approximately 1 to 20 nm as described above, the quantum dot can emit a light of a desired color. For example, a blue light emitting quantum dot (QD) may be used in the present invention. In a specific embodiment, Cd-based group II-VI QDs (e.g., CdZnS, CdZnSSe, CdZnSe, CdS, or CdSe), and non-Cd-based group II-VI QDs (e.g., ZnSe, ZnTe, ZnS, or HgS), or non-Cd-based group III-V QDs (e.g., InP, InGaP, InZnP, GaN, GaAs, or GaP) may be used as blue light emitting quantum dots (QDs).

The electron transport layer facilitates the injection of electrons from the second electrode and serves to transfer electrons to the emission layer. This electron transport layer contains Zn-containing metal oxide nanoparticles alloyed with a metal capable of increasing the ZnO band gap. For example, the electron transport layer may be formed by inkjet printing the above-described electron transport layer composition on the emission layer and then volatilizing the solvent. The electron transport layer of the present invention may be provided as a single layer structure that also serves as an electron injection layer or may be formed as a lamination structure together with a separate electron injection layer.

The second electrode is disposed on the electron injection/transport layers and may serve as a cathode. The second electrode may be formed of a metal oxide satisfying transparent/opaque conditions or other non-oxide inorganic materials, including a metal. In particular, the second electrode may be an electrode of a metal having a low work function to facilitate the injection of electrons to the LUMO energy level of the emission layer and having excellent internal reflectivity. Specifically, metals having a small work function to facilitate the injection of electrons, that is, I, Ca, Ba, Ca/Al, LiF/Ca, LiF/Al, BaF$_2$/Al, BaF$_2$/Ca/Al, Al, Mg, Ag:Mg alloys, and the like may be used.

In the above description, the light-emitting device according to the present embodiment has been assumed to be a quantum dot light-emitting device. However, unlike the above description, various types of light-emitting devices may be exemplified. As an example, the light-emitting device may be an organic light-emitting device. Additionally, the present embodiment has been described wherein the electron injection/transport layers are formed of a single material, but unlike this, the electron injection layer and the electron transport layer may be provided separately.

Hereinafter, the present invention will be described in detail with reference to examples. However, the following examples are merely for illustrating the present invention and are not intended to limit the scope of the present invention.

Example 1. Preparation of Electron Transport Layer Composition for Inkjet Printing Zinc acetate dehydrate (Zn(OAc)$_2$) and magnesium-acetate-tetrahydrate were dissolved in dimethyl-sulfoxide (DMSO), and then tetramethyl ammonium hydroxide (TMAH), a basic substance, was injected thereto, followed by heating to 60° C. and reaction for about 1 hour. The reacted ZnMgO solution was centrifuged to separate particles by addition of hexane and acetone, and DMSO, ethanol, 2-methoxyethanol, and butanol, of which the mixing ratio is a volume ratio of 5:3:1:1, were added and dispersed. An electron transport layer composition (ZnMgO nanoparticle dispersion) of Example 1 capable of inkjet printing was prepared by the same method as above.

Example 2. Preparation of Electron Transport Layer Composition for Inkjet Printing Having Ligand (1)

Zinc acetate dehydrate (Zn(OAc)$_2$) and magnesium-acetate-tetrahydrate were dissolved in dimethyl-sulfoxide (DMSO), and then tetramethyl ammonium hydroxide (TMAH), a basic substance, was injected thereto, followed by heating to 60° C. To the reaction solution, 0.2 ml of mono(2-acryloyloxyethyl) succinate (MAES) diluted to 5 wt % in ethanol was injected, followed by reaction for about 1 hour. The reacted ZnMgO solution was centrifuged to separate quantum dots by addition of hexane and acetone, and DMSO, ethanol, 2-methoxyethanol, and butanol, of which the mixing ratio is a volume ratio of 5:3:1:1, were added and dispersed. An electron transport layer composition of Example 2 capable of inkjet printing was prepared by the same method as above.

Example 3. Preparation of Electron Transport Layer Composition for Inkjet Printing Having Ligand (2)

Zinc acetate dehydrate (Zn(OAc)$_2$) and magnesium-acetate-tetrahydrate were dissolved in dimethyl-sulfoxide (DMSO), and then tetramethyl ammonium hydroxide (TMAH), a basic substance, was injected thereto, followed by heating to 60° C. To the reaction solution, 0.2 ml of mono(2-acryloyloxyethyl) succinate (MAES) was injected, followed by reaction for about 1 hour. The reacted ZnMgO solution was centrifuged to separate particles by addition of hexane and acetone, and DMSO, ethanol, 2-methoxyethanol, and butanol at a volume ratio of 5:3:1:1 were added and dispersed. An electron transport layer composition of Example 3 capable of inkjet printing was prepared by the same method as above.

Example 4. Preparation of Electron Transport Layer Composition for Inkjet Printing with Added Monomer (1)

An electron transport layer composition for inkjet printing of Example 4 was prepared by the same method as in Example 1 except that 1,6-hexanediol diacrylate monomer was mixed at a ratio of 1 vol % relative to the total 100 vol % of the electron transport layer composition (ZnMgO nanoparticle dispersion).

Example 5. Preparation of Electron Transport Layer Composition for Inkjet Printing with Added Monomer (2)

An electron transport layer composition for inkjet printing of Example 5 was prepared by the same method as in Example 1 except that 1,6-hexanediol diacrylate monomer was mixed at a ratio of 2 vol % relative to the total 100 vol % of the electron transport layer composition.

Example 6. Preparation of Electron Transport Layer Composition for Inkjet Printing with Added Monomer (3)

An electron transport layer composition for inkjet printing of Example 6 was prepared by the same method as in Example 1 except that 1,6-hexanediol diacrylate monomer was mixed at a ratio of 3 vol % relative to the total 100 vol % of the electron transport layer composition.

Example 7. Preparation of Polymer-Coated Electron Transport Layer Composition for Inkjet Printing To the reaction solution of Example 1, 0.2 ml of polyethylene glycol (PEG) having a carboxyl group was added, followed by reaction for about 1 hour. The reacted solution of ZnMgO:PEG was centrifuged, and hexane and acetone, and DMSO, ethanol, 2-methoxyethanol, and butanol at a volume ratio of 5:3:1:1 were added and dispersed. An electron transport layer composition of Example 7 capable of inkjet printing was prepared by the same method as above.

Comparative Example 1. Preparation of Electron Transport Layer Composition for Spin Coating Zinc acetate dehydrate and magnesium-acetate-tetrahydrate were dissolved in dimethyl-sulfoxide (DMSO), and then tetramethyl ammonium hydroxide (TMAH), a basic substance, was injected thereto, followed by heating to 60° C. and reaction for about 1 hour. The reacted solution of ZnMgO:PEG, hexane, and acetone were added at a volume ratio of 1:2:6, followed by solvent separation using a centrifuge, and then dispersed in ethanol, thereby preparing an electron transport layer composition of Comparative Example 1.

Comparative Example 2. Preparation of Electron Transport Layer Composition for Spin Coating Having Ligand Zn(OAc)$_2$ and TMAH were separately dissolved by the same method as above, and during the reaction of the two materials, 0.2 ml of mono(2-acryloyloxyethyl) succinate: MAES was injected relative to Zn(OAc)$_2$:TMAH (60 ml), followed by heating to 60° C. and reaction for about 1 hour. To the reacted solution of ZnMgO:MAES solution, hexane and acetone were added, followed by solvent separation using a centrifuge, and then dispersed in ethanol, thereby preparing an electron transport layer composition of Comparative Example 2.

Experimental Example 1. Spectroscopic Evaluation

Absorption spectra were measured using the electron transport layer compositions prepared in Example 1 and Comparative Example 1.

Figure 1:
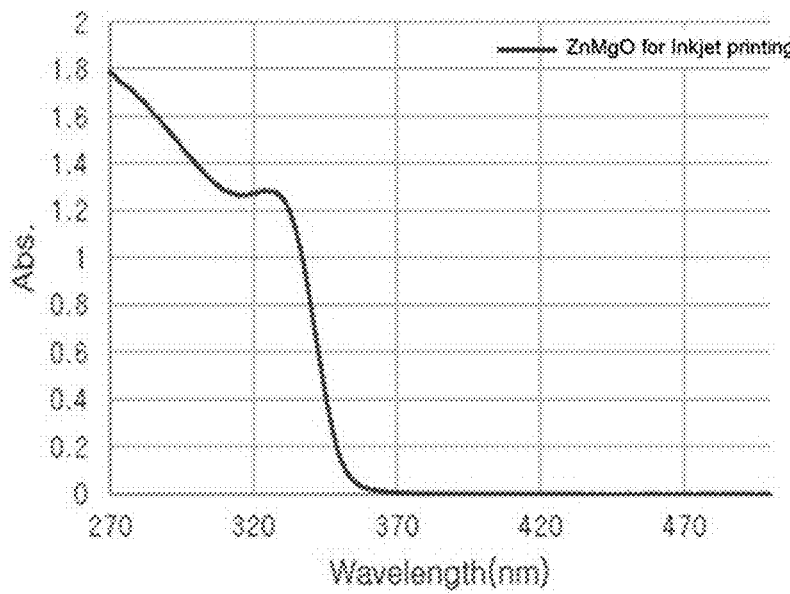
FIG. 1 shows an absorption spectrum graph of ZnMgO nanoparticles manufactured in Example 1.
Figure 2:
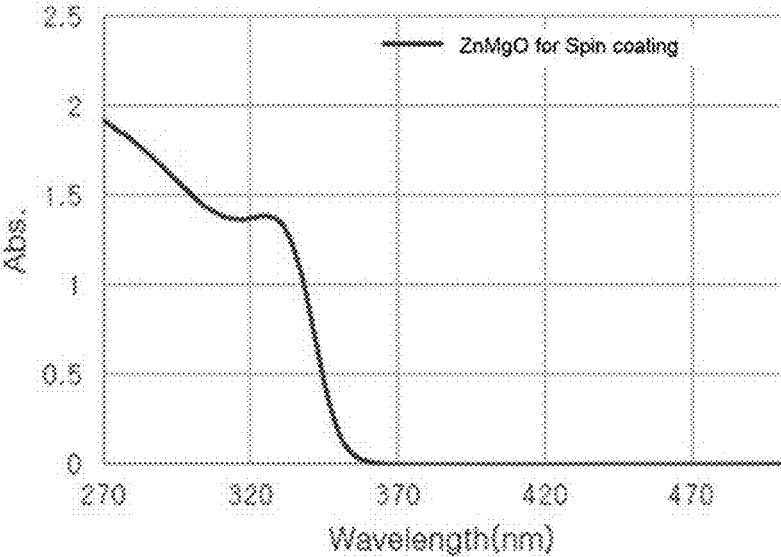
FIG. 2 shows an absorption spectrum graph of ZnMgO nanoparticles manufactured in Comparative Example 1.
Figure 3:
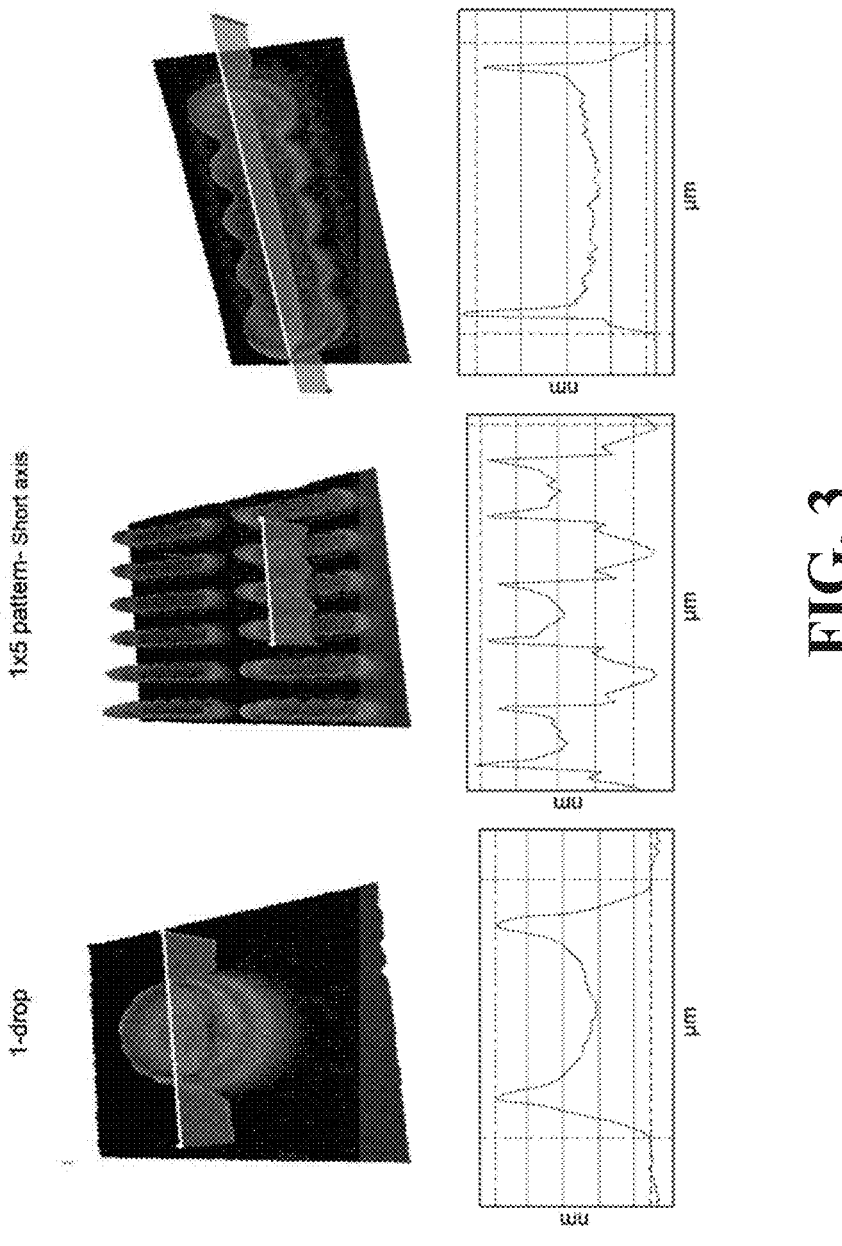
FIG. 3 shows surface shape analysis images and graphs of ejected shapes of an electron transport layer ink composition prepared in Example 1.
Figure 4:
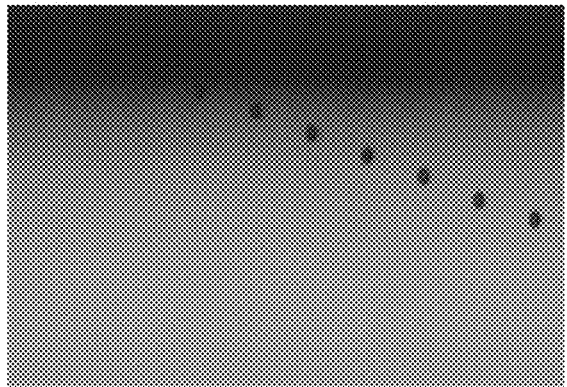
FIG. 4 shows an image of an ejected ink using an electron transport layer ink composition prepared in Example 3.
Figure 5:
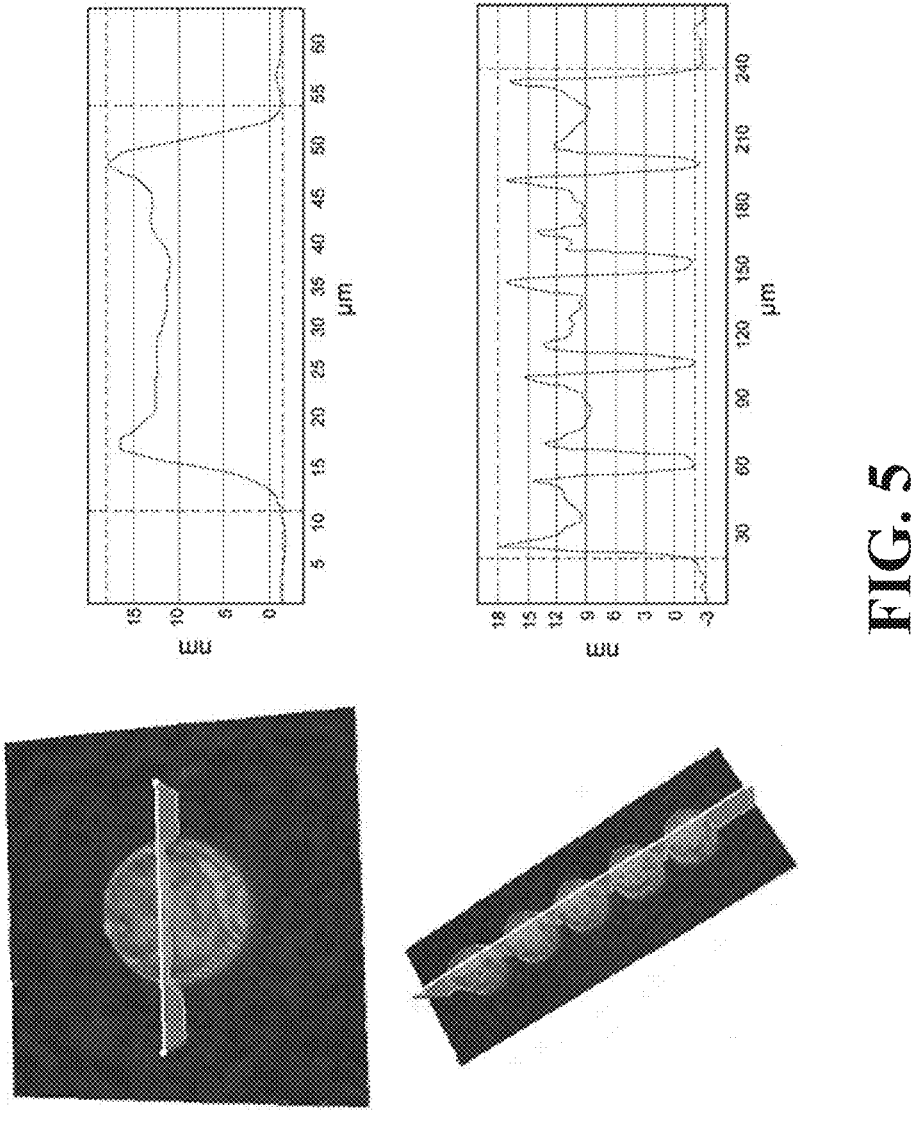
FIG. 5 shows images of a 1-drop shape and a 1*5 pattern shape of ZnMgO of an electron transport layer ink composition prepared in Example 2.
Figure 6:
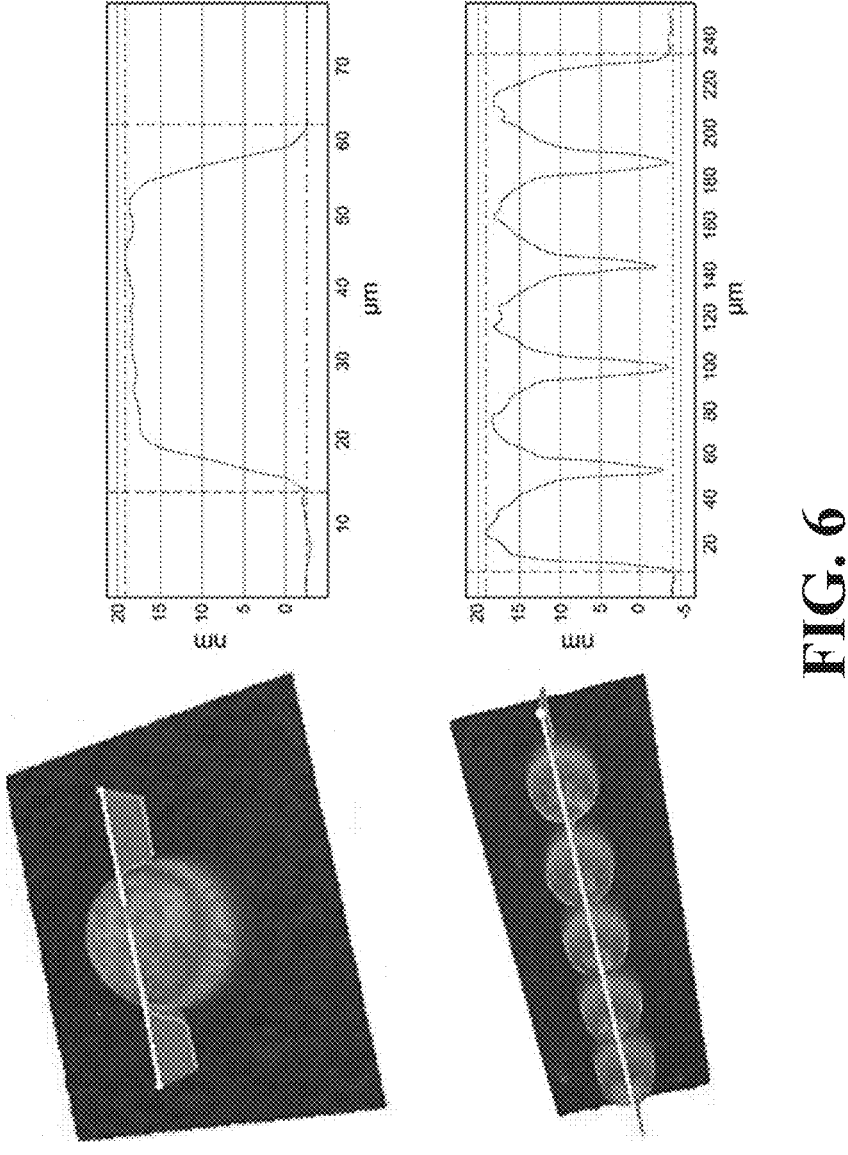
FIG. 6 shows images of a 1-drop shape and a 1*5 pattern shape of ZnMgO of the electron transport layer ink composition prepared in Example 3.
Figure 7:
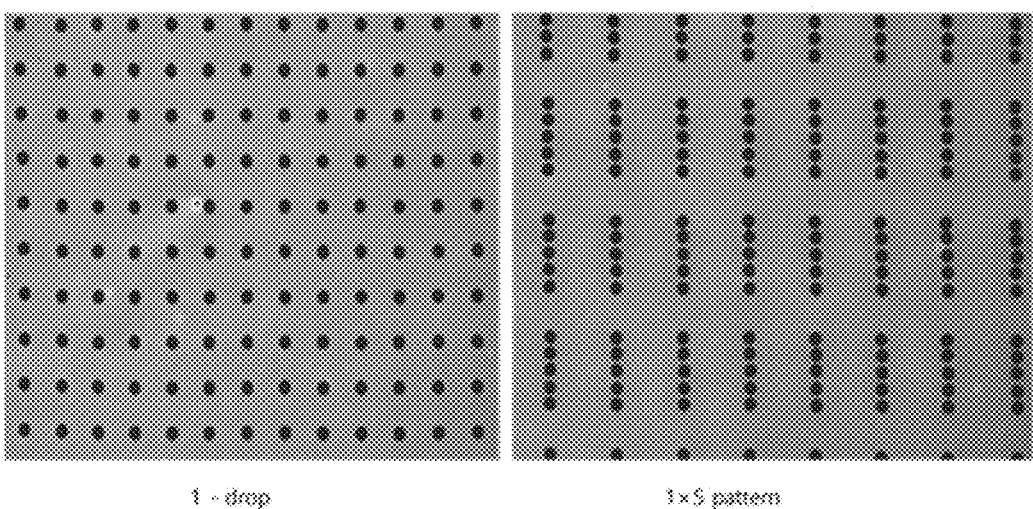
FIG. 7 shows images of 1-drop shapes and 1*5 pattern shapes formed on substrates by using the electron transport layer ink composition prepared in Example 2.
Figure 8:
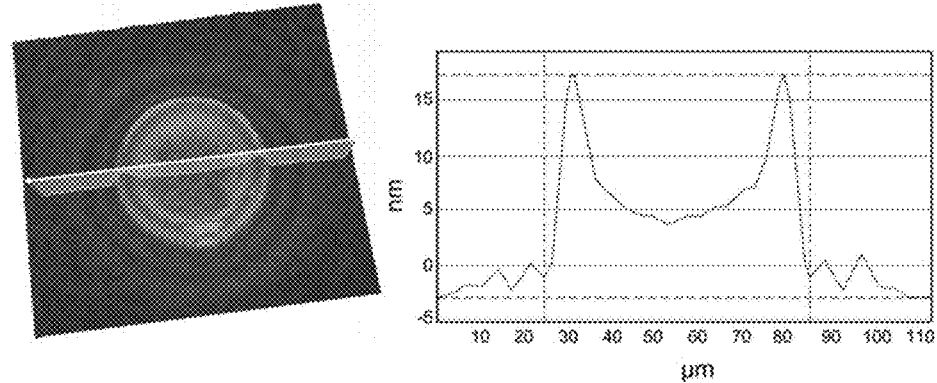
FIG. 8 shows an image of a 1-drop shape of ZnMgO of an electron transport layer ink composition prepared in Example 4.
Figure 9:
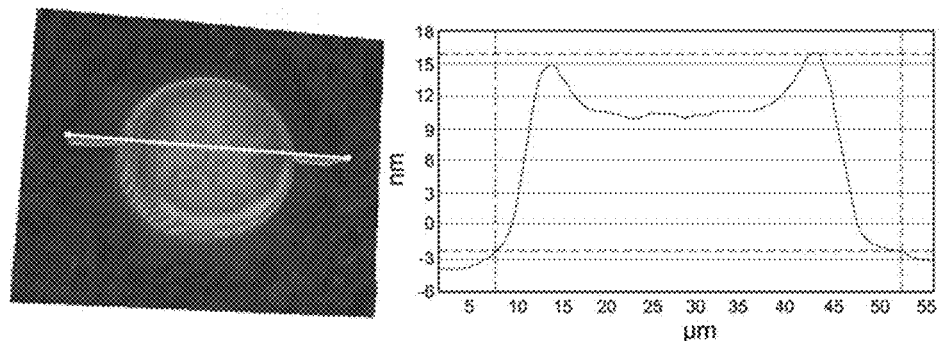
FIG. 9 shows an image of a 1-drop shape of ZnMgO of an electron transport layer ink composition prepared in Example 5.
Figure 10:
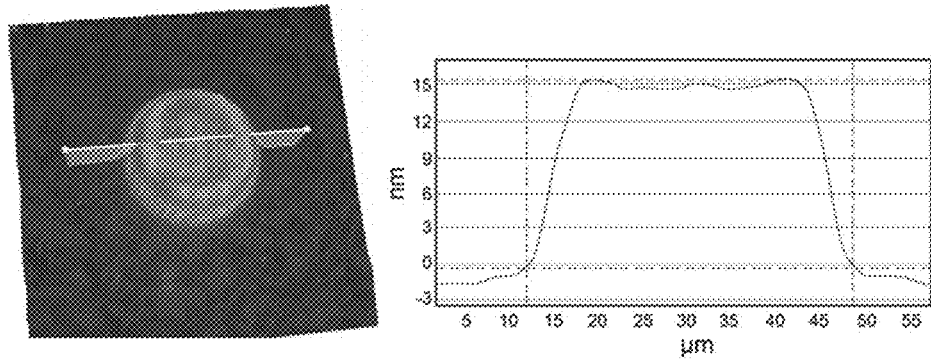
FIG. 10 shows an image of a 1-drop shape of ZnMgO of an electron transport layer ink composition prepared in Example 6.
Figure 11:
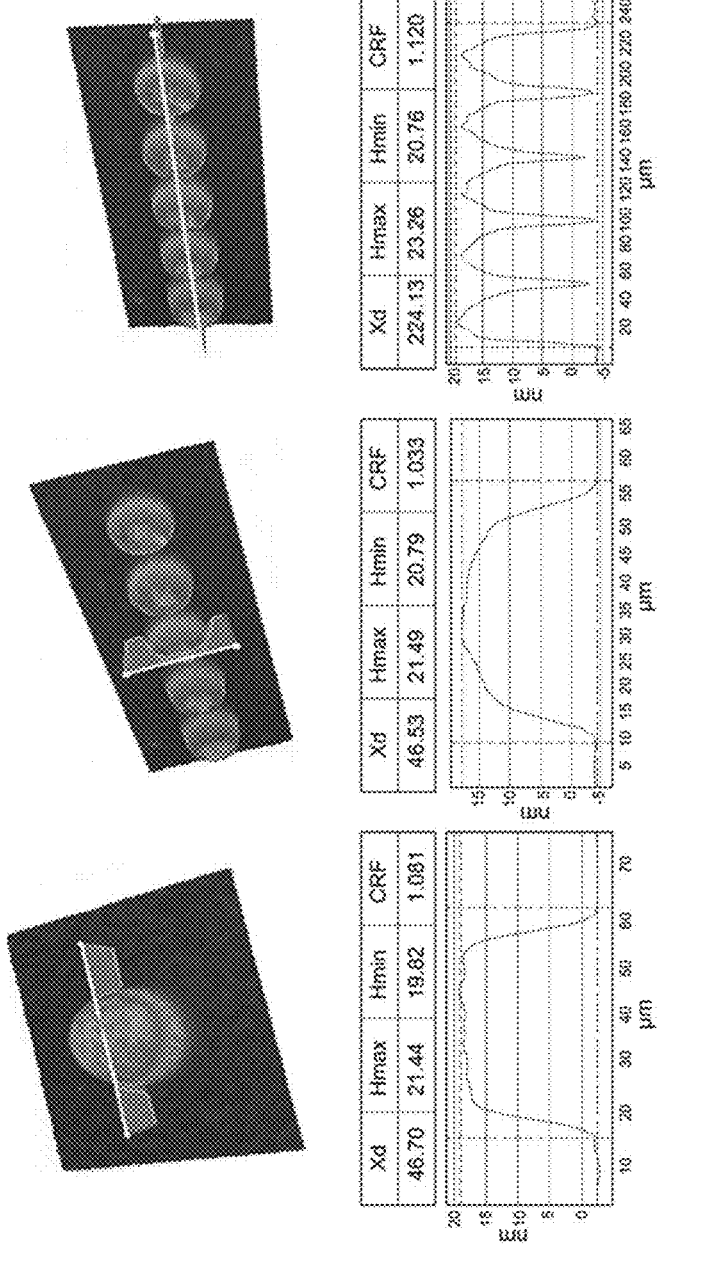
FIG. 11 shows an image of a 1-drop shape of ZnMgO of an electron transport layer ink composition prepared in Example 7.
Figure 12:
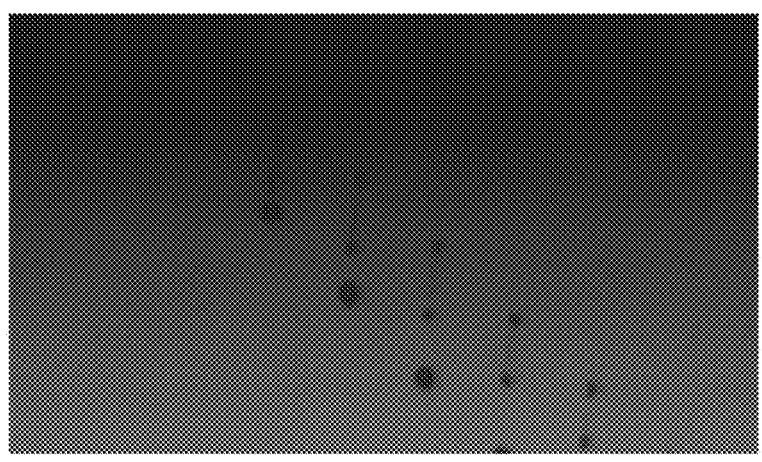
FIG. 12 shows an image of an ejected ink prepared in Comparative Example 1.
Figure 13:
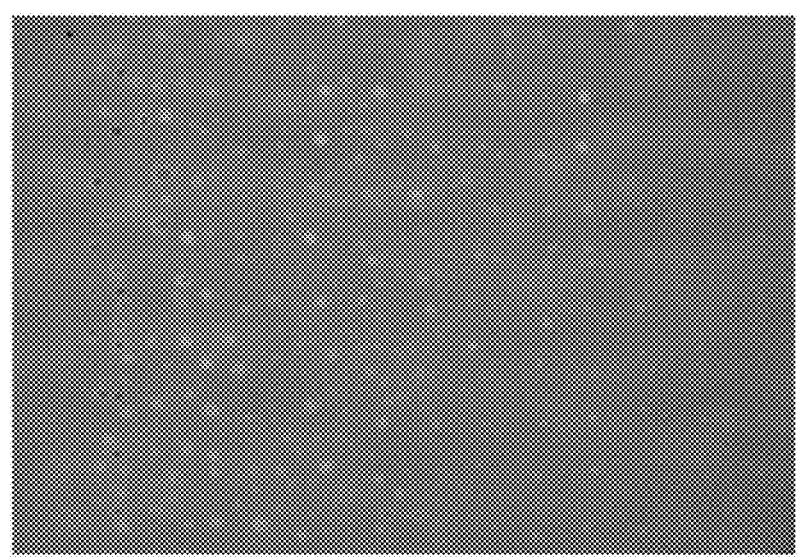
FIG. 13 shows an image of a 1-drop pattern in Comparative Example 1.
Figure 14:
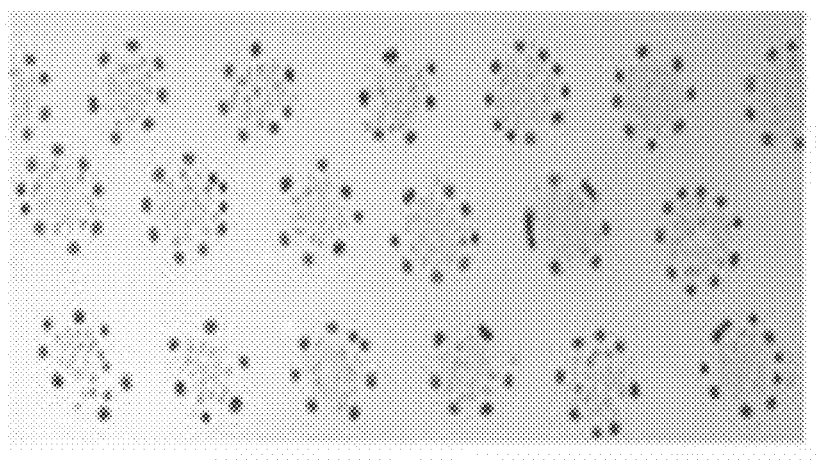
FIG. 14 shows an image of a 1-dot pattern in Comparative Example 2.

FIG. 1 shows a UV-visible absorption spectrum of ZnMgO nanoparticles synthesized in Example 1, and FIG. 2 shows a UV-visible absorption spectrum of ZnMgO nanoparticles synthesized in Comparative Example 1.

As shown in FIGS. 1 and 2, the maximum absorption wavelength of the prepared ZnMgO was approximately 330 nm, indicating that it has a wide absorption band in the ultraviolet region. Therefore, it could be identified that the same spectral characteristics were observed even when the composition for spin coating and the composition for inkjet printing were used.

Experimental Example 2. Inkjet Ejection and Morphology Evaluation

Ejection and morphology according to inkjet printing were analyzed using the electron transport layer compositions in Examples 1 to 3 and 6 to 7 and Comparative Examples 1 to 2.

Specifically, each of the prepared ink compositions was ejected by using the inkjet printing equipment (OMNI-JET200), wherein the composition was ejected in the form of a 1-drop and a 1*5 pattern formed of 5 drops.

The ink formed on a substrate was analyzed by using a three-dimensional surface shape measurement device (NV9000, Zygo), wherein Equation 1 below was introduced to quantify the degree of coffee-ring effect. The results are shown in Table 1 and FIGS. 3 to 15.

$$\text{Coffee Ring Factor, } CRF = \frac{H\text{Max}}{H\text{min}} \qquad \text{Equation 1}$$

In the above equation, $H_{Max}$ represents the maximum thickness of a pattern, $H_{Min}$ represents the minimum thickness of a pattern, and CRF value represents the degree of coffee ring effect. That is, CRF=1 indicates that the coffee ring has been completely removed.

TABLE 1

|  | Dot | Line-short axis | Line-long axis |
|---|---|---|---|
| Example 1 | 1.586 | 1.278 | 2.023 |
| Example 2 | 1.550 | 1.838 | 1.882 |
| Example 3 | 1.081 | 1.033 | 1.120 |
| Example 6 | 1.056 | 1.021 | 1.125 |
| Example 7 | 1.081 | 1.033 | 1.120 |
| Comparative Example 1 | Unable to form pattern | | |
| Comparative Example 2 | Unable to form pattern | | |

It could be seen as shown in Table 1 that ejection and pattern formation by ink-jetting were impossible in Comparative Examples 1 and 2. On the other hand, the electron transport layer composition of the present invention having at least three solvents with different properties that had been mixed could be easily ejected by general inkjet printing equipment and also showed uniform characteristics in terms of both the ejected ink and the morphology of the ink formed on the substrate, and thus could be advantageously applied to inkjet printing (see FIGS. 3 to 16).

Experimental Example 3. Fabrication of Light-Emitting Devices and Evaluation of Properties Thereof Light-emitting devices were fabricated using the electron transport layer compositions in Examples 1 to 3 and 6 to 7 and Comparative Examples 1 and 2, and then properties thereof were evaluated.

Specifically, an indium tin oxide (ITO) substrate was washed with isopropyl alcohol and acetone for 15 min each and then dried in an oven at 60° C. for 30 min. The dried substrate was treated with UV-ozone for 20 min, and then spin-coated with PEDOT:PSS, thereby forming a hole injection layer (HIL). Particularly, spin coating conditions were 4,500 rpm/60 s, and thermal treatment conditions were 150° C./20 min.

Thereafter, a film was formed using a TFB material dissolved at 6 mg/ml in chlorobenzene, under a nitrogen gas (N$_2$) atmosphere at 4500 rpm/30 s, and thermally treated for 15° C./30 min to form a hole transport layer (HTL).

After that, to form an emission layer (EML), a dispersion of indium phosphide (InP)-based quantum dots in 5 ml of octane was spin-coated at 3,500 rpm/20 s to form a thin film.

Thereafter, each of the electron transport layer compositions prepared in Examples 1 to 3 and 6 to 7 and Comparative Examples 1 to 2 was coated by ink-jetting to form an electron transport layer (ETL), and then electrodes were formed through vacuum thermal evaporation, thereby manufacturing respective light emitting devices.

The light emitting devices manufactured by the above-described methods were evaluated for device efficiency by using an IVL measurement system, and the results are shown in Table 2 below and FIGS. 16 and 17.

TABLE 2

|  | EQE (%) | Luminance (Cd/m$^2$) | Turn-on voltage (V) |
|---|---|---|---|
| Example 1 | 1.39 | 5,300 | 2.2 |
| Example 2 | 1.71 | 7,800 | 2.4 |
| Example 3 | 1.23 | 7,100 | 2.2 |
| Example 6 | 1.64 | 7,200 | 2.2 |
| Example 7 | 1.54 | 7,800 | 2.2 |
| Comparative Example 1 | Device driving being impossible | | |

TABLE 2-continued

| | EQE (%) | Luminance (Cd/m$^2$) | Turn-on voltage (V) |
|---|---|---|---|
| Comparative Example 2 | | Device driving being impossible | |

As shown in Table 2 above, it could be seen that the driving of the light emitting devices of Comparative Examples 1 and 2 was impossible. However, the light emitting devices of Examples 1 to 3 and 6 to 7 including electron transport layers formed using the electron transport layer compositions of the present invention had low driving voltages and both excellent light emission efficiency and external quantum efficiency (EQE) (see FIGS. 16 and 17).

The invention claimed is:

1. An electron transport layer composition for inkjet printing, comprising:

metal oxide nanoparticles; and at least three solvents that differ in terms of at least one of viscosity, polarity, or vapor pressure, wherein the composition is capable of being ejected by ink-jetting; and wherein the composition has a viscosity of 1.0 to 3.0 cps at 20° C. a vapor pressure of 0.6 to 45 mmHg at 20° C., a contact angle of 25 to 80°, and a solid content of 5 to 30 wt %.

2. The composition of claim 1, wherein the at least three solvents include dimethyl sulfoxide (DMSO), ethanol, 2-methoxy ethanol, and butanol.

3. The composition of claim 2, wherein a mixing ratio of the dimethyl sulfoxide (DMSO), ethanol, 2-methoxy ethanol, and butanol is a volume ratio of 3-8:1-3:1-2:0-1.

4. The composition of claim 1, wherein the metal oxide nanoparticles are Zn-containing metal oxide nanoparticles.

5. The composition of claim 4, wherein in the Zn-containing metal oxide nanoparticles, a metal capable of increasing a ZnO band gap is alloyed.

6. The composition of claim 4, wherein the Zn-containing metal oxide nanoparticles are ZnMgO.

7. The composition of claim 1, wherein the metal oxide nanoparticles have an organic ligand having hydrophilic moieties attached to a portion of or an entire surface thereof.

8. The composition of claim 7, wherein the organic ligand includes at least two hydrophilic moieties selected from a carboxyl group and a hydroxyl group.

9. The composition of claim 7, wherein the organic ligand is contained in a range of 0.0001 to 10 mol relative to 1 mol of a metal included in the metal oxide nanoparticles.

10. The composition of claim 1, wherein the metal oxide nanoparticles include a polymer coating layer formed on a portion of or an entire surface thereof.

11. A light-emitting device, comprising:

a first electrode;

a second electrode disposed to face the first electrode;

an emission layer disposed between the first electrode and the second electrode;

a hole transport layer disposed between the first electrode and the emission layer; and an electron transport layer disposed between the emission layer and the second electrode, the electron transport layer comprising:

metal oxide nanoparticles; and at least three solvents that differ in terms of at least one of viscosity, polarity, or vapor pressure;

wherein the electron transport layer has a viscosity of 1.0 to 3.0 cps at 20° C. a vapor pressure of 0.6 to 45 mmHg at 20° C., a contact angle of 25 to 80°, and a solid content of 5 to 30 wt %.

12. The light-emitting device of claim 11, wherein the electron transport layer is formed by inkjet printing.

13. The light-emitting device of claim 11, wherein the light-emitting device further comprises at least one of a hole injection layer or an electron injection layer.

14. The light-emitting device of claim 11, wherein the at least three solvents include dimethyl sulfoxide (DMSO), ethanol, 2-methoxy ethanol, and butanol.

15. The light-emitting device of claim 14, wherein a mixing ratio of the dimethyl sulfoxide (DMSO), ethanol, 2-methoxy ethanol, and butanol is a volume ratio of 3-8:1-3:1-2:0-1.

16. A method for preparing an electron transport layer composition for inkjet printing, the method comprising:

a first step of adding a basic substance to a reaction solution, in which a zinc-containing compound and a compound containing a metal capable of increasing a ZnO band gap are dissolved, followed by precipitation, thereby preparing a metal oxide nanoparticle dispersion; and a second step of adding, to the prepared metal oxide nanoparticle dispersion, the at least three solvents that differ in terms of at least one of viscosity, polarity, or vapor pressure, followed by mixing, thereby preparing the electron transport layer composition;

wherein the electron transport layer composition has a viscosity of 1.0 to 3.0 cps at 20° C. a vapor pressure of 0.6 to 45 mmHg at 20° C. a contact angle of 25 to 80°, and a solid content of 5 to 30 wt %.

17. The method of claim 16, wherein the metal oxide nanoparticle dispersion in the first step further contains an organic ligand, the organic ligand being contained in a content of 10 wt % or less relative to 100 wt % of the metal oxide nanoparticle dispersion.

18. The method of claim 16, wherein the electron transport layer composition prepared in the second step further contains a monomer, the monomer being contained in a content of 10 vol % or less relative to 100 vol % of the electron transport layer composition.

* * * * *